(12) United States Patent
Jeng et al.

(10) Patent No.: US 7,776,627 B2
(45) Date of Patent: Aug. 17, 2010

(54) FLEXIBLE STRUCTURES FOR INTERCONNECT RELIABILITY TEST

(75) Inventors: Shin-Puu Jeng, Hsin-Chu (TW);
Shang-Yun Hou, Jubei (TW); Hao-Yi Tsai, Hsin-Chu (TW); Anbiarshy N. F. Wu, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 11/971,072

(22) Filed: Jan. 8, 2008

(65) Prior Publication Data
US 2009/0011539 A1    Jan. 8, 2009

Related U.S. Application Data

(60) Provisional application No. 60/947,896, filed on Jul. 3, 2007.

(51) Int. Cl.
*H01L 21/66* (2006.01)
(52) U.S. Cl. ....................................................... 438/18
(58) Field of Classification Search ........................ None
See application file for complete search history.

(56) References Cited

U.S. PATENT DOCUMENTS

| | | | | |
|---|---|---|---|---|
| 5,128,737 A | * | 7/1992 | van der Have | 257/503 |
| 5,514,884 A | * | 5/1996 | Hively et al. | 257/203 |
| 2002/0042007 A1 | * | 4/2002 | Miyazaki et al. | 430/5 |
| 2007/0288219 A1 | * | 12/2007 | Zafar et al. | 703/14 |

* cited by examiner

*Primary Examiner*—Charles D Garber
*Assistant Examiner*—Andre' C Stevenson
(74) *Attorney, Agent, or Firm*—Slater & Matsil, L.L.P.

(57) ABSTRACT

A method for forming an integrated circuit structure includes forming a test wafer. The step of forming the test wafer includes providing a first semiconductor substrate; and forming a first plurality of unit blocks over the first semiconductor substrate. Each of the first plurality of unit blocks includes a plurality of connection block cells arranged as an array. Each of the connection block cells includes two connection blocks, and a metal line connecting the two connection blocks. The method further includes forming a plurality of unit block boundary lines separating the first plurality of unit blocks from each other; and forming a first plurality of metal lines connecting a portion of the first plurality of unit blocks.

21 Claims, 10 Drawing Sheets

FLEXIBLE STRUCTURES FOR INTERCONNECT RELIABILITY TEST

This application claims the benefit of the following provisionally filed U.S. Patent application: Application Ser. No. 60/947,896, filed Jul. 3, 2007, entitled "Test Structure for Interconnect Reliability Test," which patent application is incorporated herein by reference.

TECHNICAL FIELD

This invention relates generally to the packaging of integrated circuits, and more particularly to the interconnect reliability test of package structures.

BACKGROUND

The fabrication of modern circuits typically includes several steps. Integrated circuits are first fabricated on a semiconductor wafer, which contains multiple duplicate semiconductor chips, each including integrated circuits formed thereon. The semiconductor chips are then sawed from the wafer and packaged. The packaging processes have two main purposes: to protect delicate semiconductor chips; and to connect interior integrated circuits to exterior pins.

In conventional packaging processes, semiconductor chips are often mounted on a substrate using flip-chip bonding or wire bonding. Underfill is used to prevent cracks from being formed in solder bumps or solder balls, wherein cracks are typically caused by thermal stresses.

When the integrated circuits are powered on, the temperatures of the semiconductor chips and the packages, including the semiconductor chips and the substrates, increase. Under the respective thermal stresses, the internal structures in the packages may be damaged. To ensure the semiconductor chips, particularly the low-k (or extreme low-k) dielectric materials and the interconnect structures formed therein, are reliable, test structures are formed on which tests are performed.

FIG. 1 illustrates conventional test die 10, which includes a plurality of via stacks 12 formed in pairs and distributed throughout test die 10. The via stacks 12 in a same pair are interconnected by a metal line 14, which may be formed in a metallization layer. There are no electrical connections between via stack pairs.

Referring to FIG. 2, for the reliability tests, neighboring via stack pairs are interconnected through (package) substrate 16, which is bonded to die 10 through solder bumps 18. Each via stack 12 corresponds to one, and only one, of solder bumps 18. FIG. 2 illustrates a cross-sectional view of the bonded package structure. It is noted that the neighboring via stacks 12 are interconnected through redistribution lines (RDL) 20 in substrate 16. By forming RDLs 20 corresponding to the positions of the neighboring via stacks 12, the via stacks 12 in die 10 may be connected to form one or more daisy chains. In each daisy chain, the electrical path includes a plurality of via stacks 12, a plurality of metal lines 14, and a plurality of RDLs 20. By monitoring the resistance between two end points of each of the daisy chains, the reliability of the interconnect structure in test die 10 and the package structure may be determined, and the thermo-mechanical failures attributed to stress testing may be found. Apparently, the degradation in the reliability will cause the resistance measured at the two ends of the daisy chain to increase.

A common problem of the test scheme discussed in the preceding paragraphs is that the bump pitch and chip size are not flexible, and are fixed after design. When a customer provides a new product or a new design requiring a new package type or a new package material, the customer typically requires the foundry to provide test wafers for evaluation. However, each customer has different package types and/or different requirements than other customers, thus the test die size and bump pitch differ from customer to customer, and maybe from product to product. Accordingly, each of the new products and/or new designs may involve a change in pitch, and hence the pitch of the new product and/or design does not match the pitch of the old test dies. Thus, the changed RDLs 20 can no longer provide interconnection between the neighboring connection blocks to form daisy chains. Unfortunately, changing the pitch of die 10 requires a full redesign and re-tape out of the masks, and hence is difficult, time consuming, and costly. These problems need to be addressed.

SUMMARY OF THE INVENTION

In accordance with one aspect of the present invention, an integrated circuit structure includes a substrate; a plurality of bumps over the substrate, the plurality of bumps having a bump pitch; at least three connection blocks located within the range of the bump pitch; at least one conductive feature connecting two of the at least three connection blocks; and at least one inter-connection metal line connecting two of the at least three connection blocks.

In accordance with another aspect of the present invention, an integrated circuit structure includes a semiconductor substrate; a plurality of connection block cells over the semiconductor substrate and arranged in a repeated pattern, wherein each of the plurality of connection block cells includes two connection blocks and a metal line in a metallization layer connecting the two connection blocks; a plurality of bond pads over the plurality of connection block cells, wherein the plurality of bond pads has a first pitch no less than a second pitch of the plurality of connection block cells, and wherein the plurality of bond pads include a first, a second, and a third bond pad, and wherein the second bond pad is between and neighboring the first and the third bond pads; and a plurality of metal lines serially connecting connection blocks between the first and the second bond pads to form a daisy chain. At least one connection block between the second and the third bond pads is electrically disconnected from the second and the third bond pads.

In accordance with yet another aspect of the present invention, an integrated circuit structure includes a semiconductor substrate; and a plurality of unit blocks over the semiconductor substrate. Each of the plurality of unit blocks includes a plurality of connection block cells over the semiconductor substrate and arranged as an array, wherein each of the plurality of connection block cells includes two connection blocks and a metal line in a bottom metallization layer connecting the two connection blocks; and a plurality of bond pads over and connected to the plurality of the connection block cells, wherein the plurality of bond pads has a first pitch no less than a second pitch of the plurality of connection block cells. The integrated circuit structure further includes a plurality of unit block boundary lines separating each of the plurality of unit blocks from others.

In accordance with yet another aspect of the present invention, a method for forming an integrated circuit structure includes forming a first test wafer, which includes providing a first semiconductor substrate; and forming a first plurality of unit blocks over the first semiconductor substrate. Each of the first plurality of unit blocks includes a plurality of connection block cells arranged as an array, wherein each of the connection block cells includes two connection blocks, and an a metal line in a bottom metallization layer and connecting the two connection blocks. The method further including forming a plurality of unit block boundary lines separating the first plurality of unit blocks from each other; and forming a first plurality of metal lines connecting a portion of the first plurality of unit blocks.

In accordance with yet another aspect of the present invention, a method for verifying an IC design includes receiving a chip design, and verifying the chip design comprising forming a test structure comprising a plurality of tile-like unit blocks arranged by rows and columns.

In accordance with yet another aspect of the present invention, a method for verifying an IC design includes receiving a chip design, and verifying the chip design including forming a test structure comprising a plurality of connection blocks arranged as a breadboard pattern.

Advantageously, by using the embodiments of the present invention, the cost related to the redesign of masks of test wafers is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
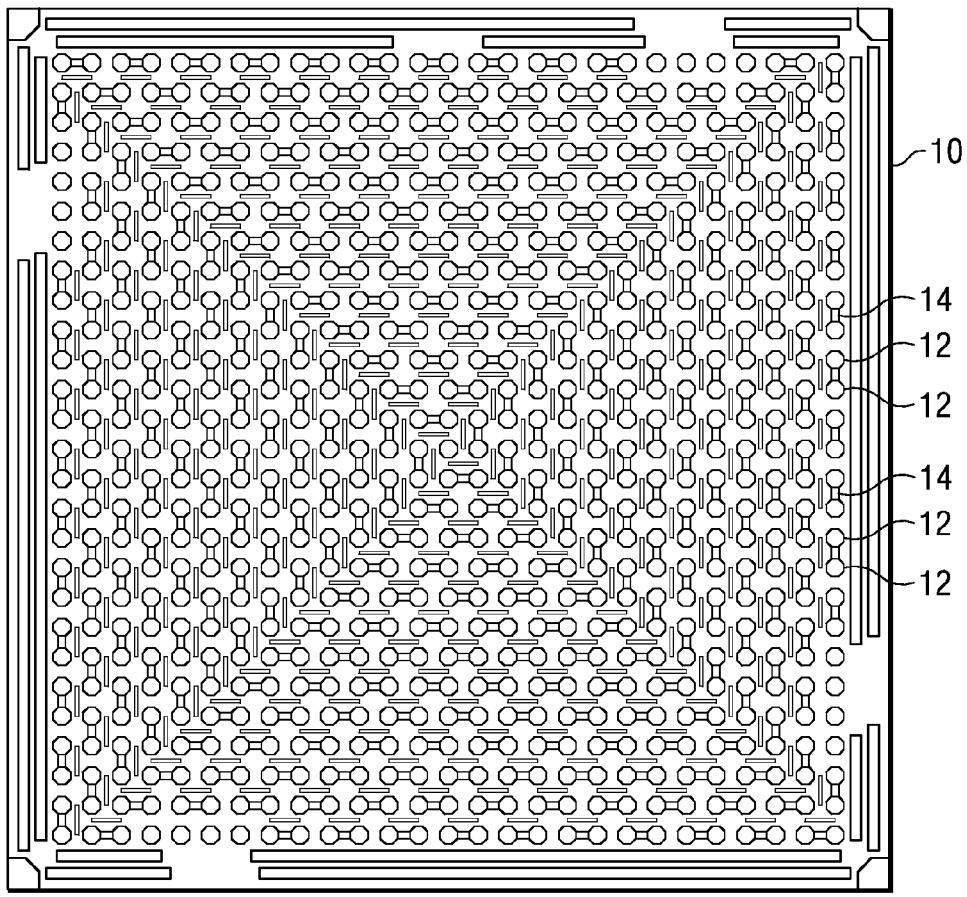
FIG. 1 illustrates a top view of a conventional test die including a plurality of via stacks.
Figure 2:
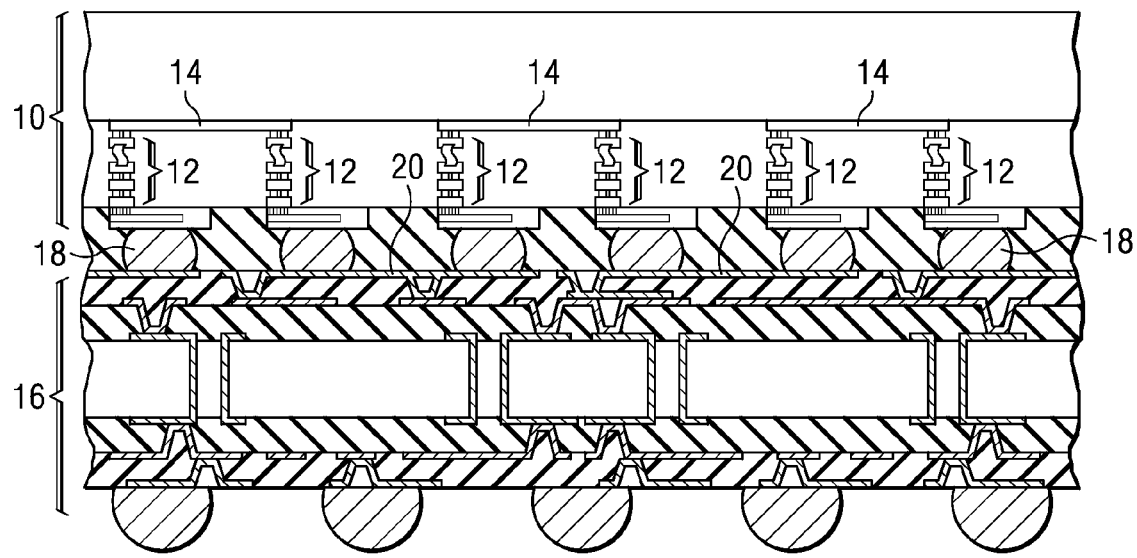
FIG. 2 illustrates a cross-sectional view of a conventional test structure including a test die bonded onto a package substrate, wherein the via stacks are interconnected into a daisy chain through the package substrate.
Figure 3A:
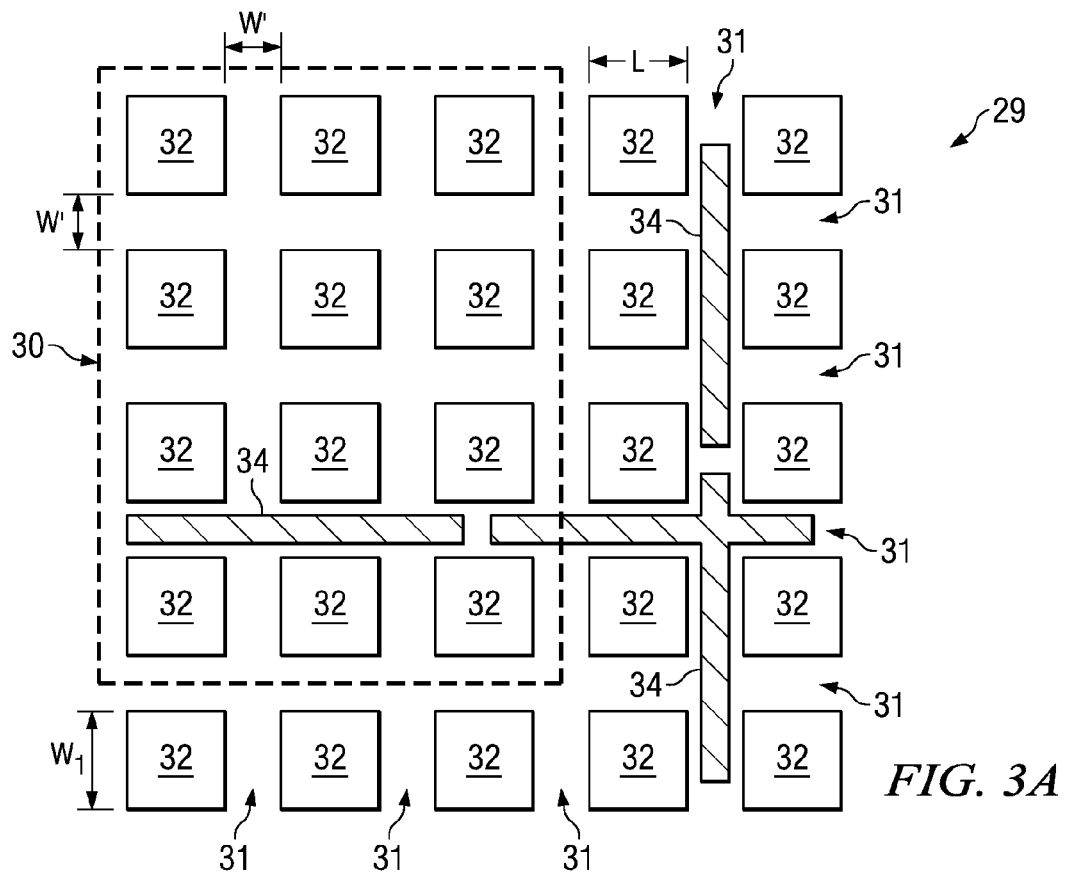
FIG. 3A illustrates a portion of a test wafer including a plurality of unit blocks separated by unit block boundary lines.
Figure 3B:
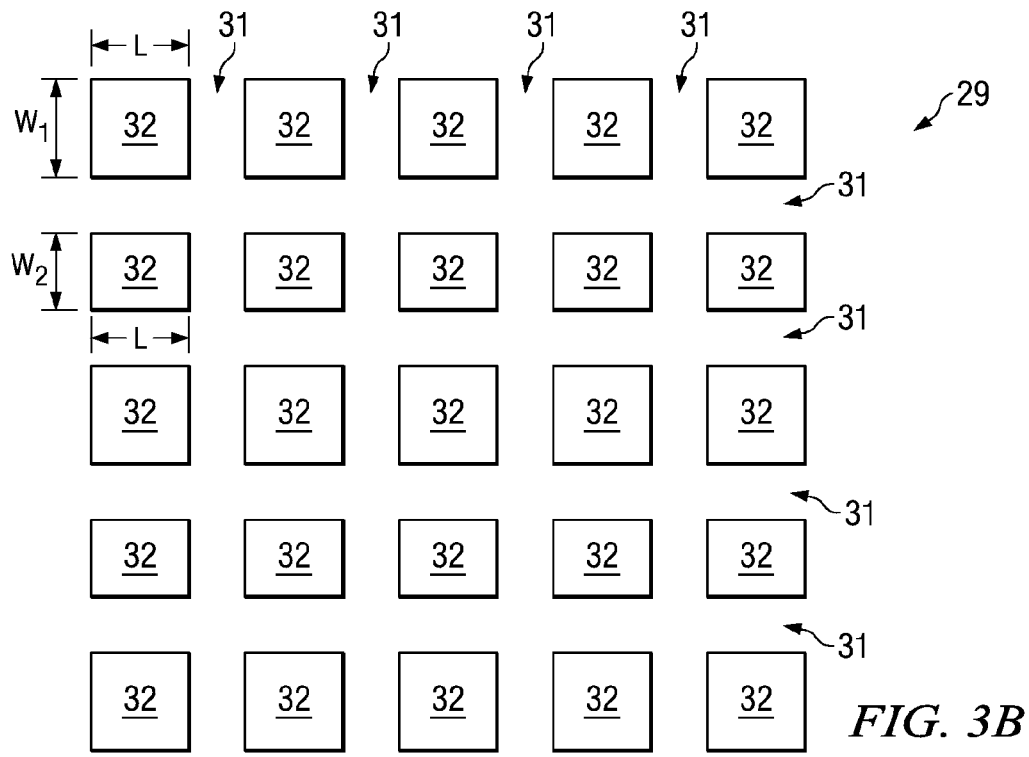
FIG. 3B illustrates a portion of test wafer including a plurality of unit blocks separated by unit block boundary lines, wherein the unit blocks in different rows or columns have different sizes.

FIG. 3A illustrates an embodiment of the present invention. Test die 30 is formed as a part of test wafer 29, which may include a plurality of dies identical to test die 30, or having different designs and/or sizes than test die 30. Test wafer 29 includes a plurality of unit blocks 32 having a tile-like pattern with a plurality of rows and columns. In an embodiment, unit blocks 32 are identical. In other embodiments, as shown in FIG. 3B, alternative rows (or columns) of unit blocks 32 have different widths (for example, width W1 in the first row and width W2 in the second row), but same length L. In an exemplary embodiment, length L is about 5.2 mm, while widths W1 and W2 are about 5.2 mm and about 3.55 mm, respectfully. The optimal lengths and widths of unit blocks 32 may be determined by the desirable lengths and widths of test dies that will be sawed from test wafer 29. It is preferable that by selecting different numbers of rows and columns of unit blocks 32, the resulting sizes of the test dies that can be sawed from test wafer 29 fit the common sizes of the dies.

Figure 3C:
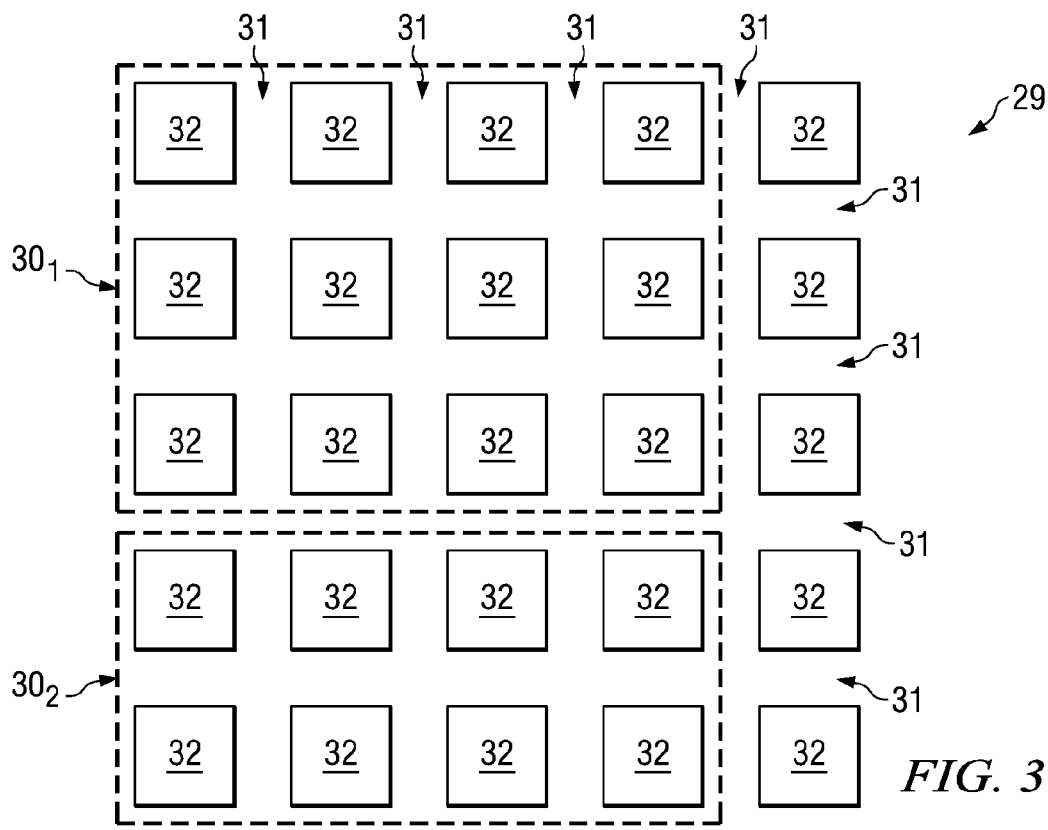
FIG. 3C illustrates two test dies sawed from a test wafer.

Unit blocks 32 are separated by unit block boundary lines 31. Preferably, unit block boundary lines 31 have width W' substantially equal to the common widths of scribe lines between semiconductor chips on wafers. In an exemplary embodiment, width W' of unit block boundary lines 31 is between about 30 µm and about 160 µm. Advantageously, the test wafers provided by the present invention can be used to saw into test dies having different sizes, wherein the kerf lines pass through the unit block boundary lines 31. For example, FIG. 3C illustrates a test wafer 29, from which test dies $30_1$ and $30_2$ are sawed. Test dies $30_1$ and $30_2$ have different sizes. Therefore, from a same test wafer 29, a plurality of test dies 30 having different combinations of sizes may be obtained.

Figure 3D:
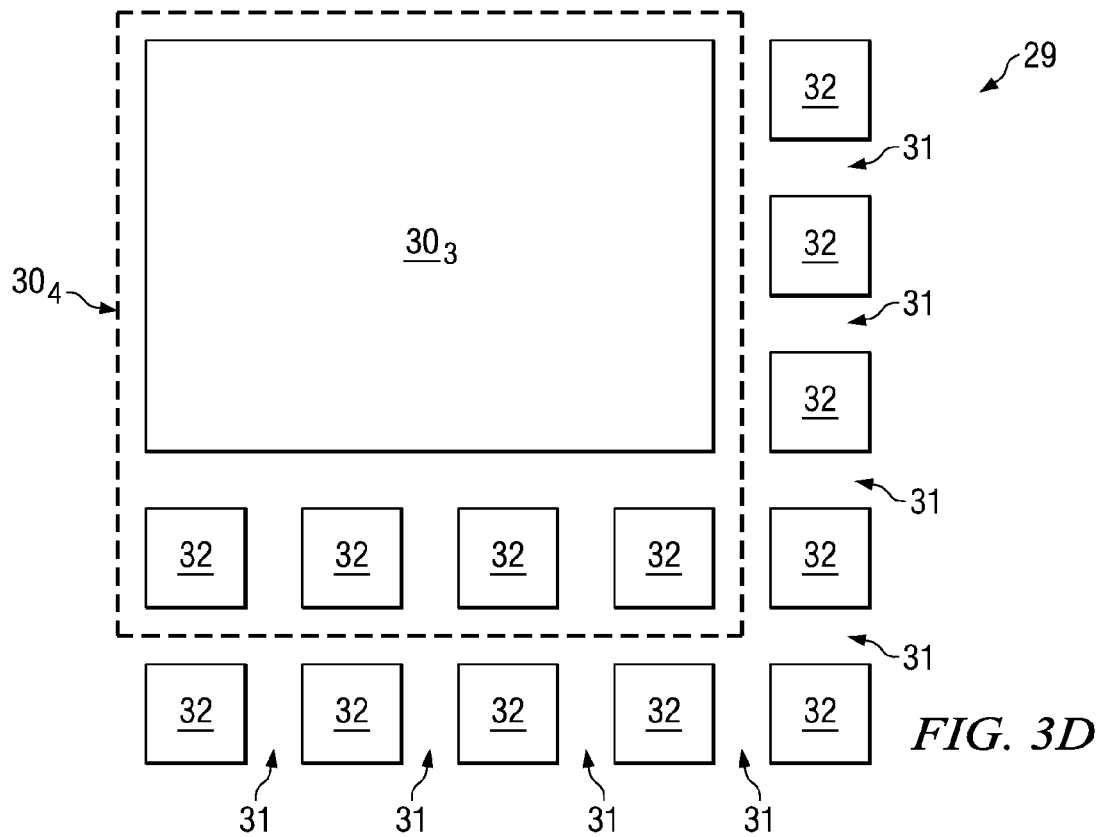
FIG. 3D illustrates a test die in a test wafer and additional unit blocks adjacent the test die, wherein the test die includes no unit block boundary lines therein.

FIG. 3D illustrates an alternative embodiment of the present invention, wherein test wafer 29 includes test die $30_3$, which includes no unit block boundary lines therein. Unit block boundary lines 31 are formed outside test die $30_3$. Advantageously, test die $30_3$ may either be sawed as a test die by itself only, or, alternatively, combined with other unit blocks 32 to form a test die with a greater size, such as test die $30_4$.

In FIGS. 3A through 3D, each of the unit block boundary lines 31 may include one or more of process control monitor (PCM) test lines 34, as is shown in FIG. 3A. As is known in the art, PCM test lines 34 may include active circuits and test pads, which test pads are on the top surface of wafer 29. Accordingly, unlike conventional test dies having PCM test lines only on the scribe lines, which are on the edges of the test dies and will be sawed, the test dies of the present invention may include internal PCM test lines 34, which may not be sawed.

Figure 4:
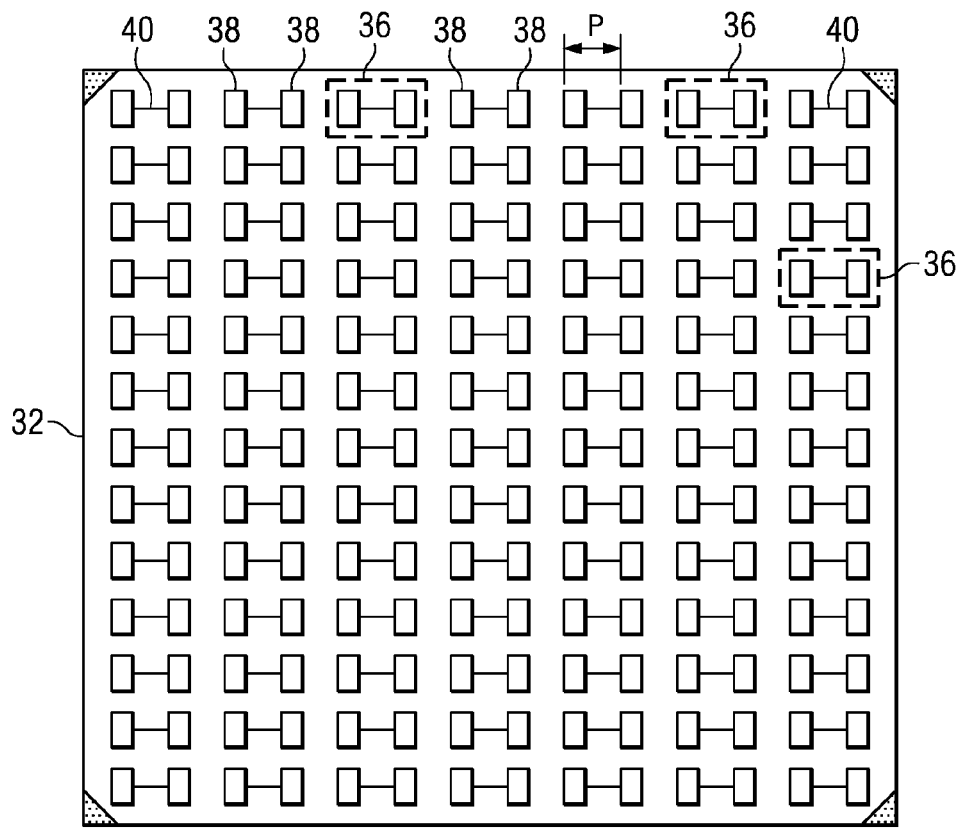
FIG. 4 schematically illustrates a top view of a unit block including a plurality of connection block cells.

FIG. 4 illustrates a schematic top view of an exemplary unit block 32, which includes a plurality of periodically located connection block cells 36. Preferably, connection block cells 36 are arranged as an array, although they can be arranged in other periodic forms such as hexagons. The pitch P of connection blocks 38 is preferably much smaller than the minimum pitch of solder bumps (not shown) in the technology used for forming test wafer 29. In an exemplary embodiment, pitch P of connection blocks 38 is about 20 µm. In another exemplary embodiment, pitch P is less than about 10 percent of the minimum pitch, and more preferably less than about 5 percent of the minimum pitch. Accordingly, between two neighboring solder bumps, there will be several connection block cells 36. The details are discussed in subsequent paragraphs.

Figure 5A:
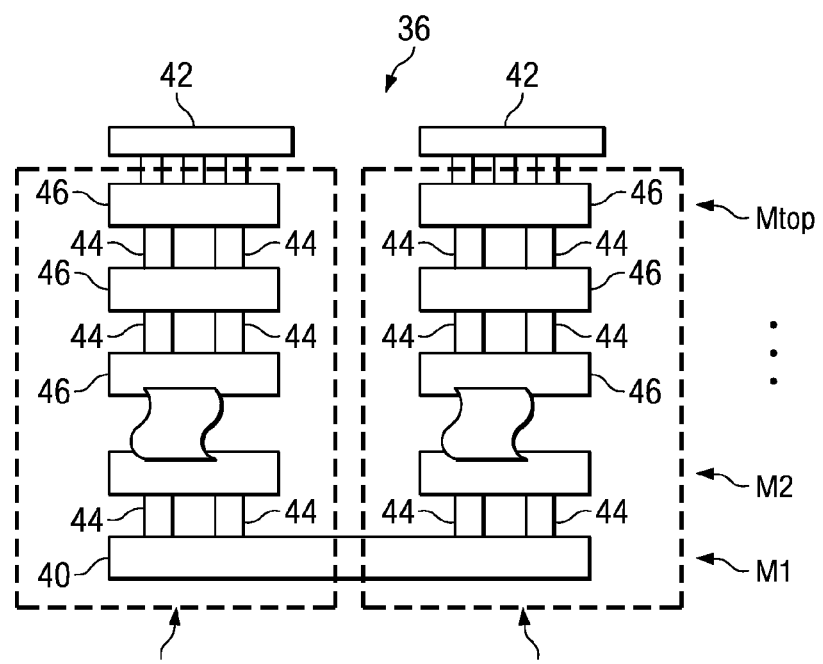
FIGS. 5A and 5B are cross-sectional views of two exemplary connection block cells.

Each of the connection block cells 36 includes at least two connection blocks 38. FIG. 5A illustrates a cross-sectional view of an exemplary connection block cell 36 including two connection blocks 38. Connection blocks 38 include metal pads 46 and connecting vias 44, wherein metal pads 46 are formed from the bottom metallization layer (often referred to as M1) to the top metallization layer (often referred to as Mtop). Connection blocks 38 may further include conductive pads 42 over the metal pads 46 in top metallization layer Mtop. Metal pads 46 may be formed in a same level, and formed of a same material, as redistribution lines. Throughout the description, conductive pads 42 are also referred to as aluminum pads 42, although they can be formed of other metals such as copper or bond pads 42 if they are exposed.

Figure 5B:
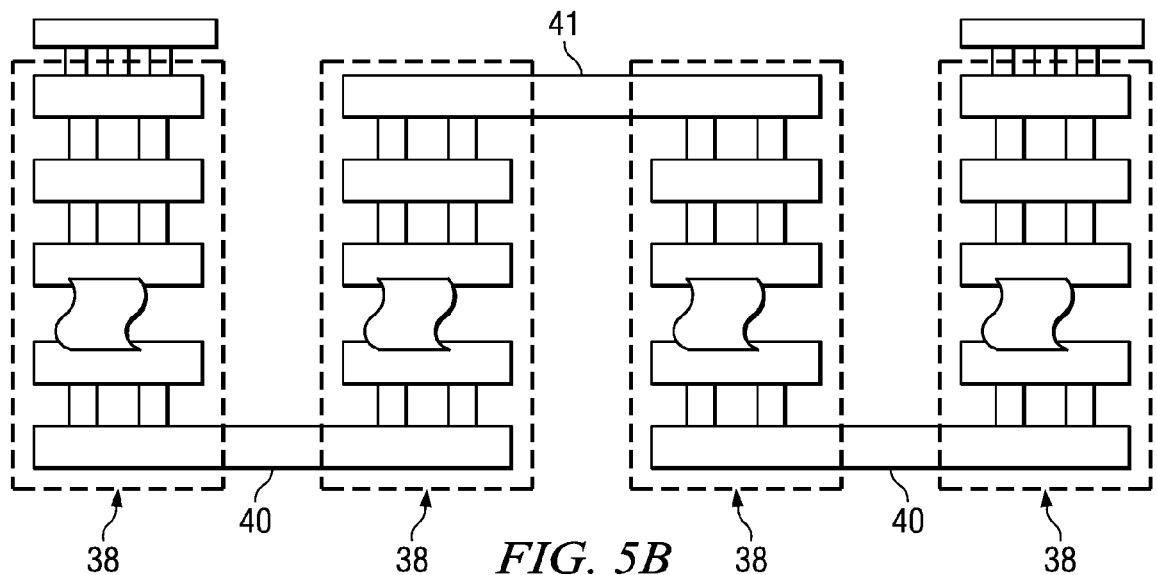

In the preferred embodiment, each of the connection block cells 36 includes only two interconnect connection blocks 38. In alternative embodiments, as shown in FIG. 5B, each of the connection block cells 36 may include four, six, or even more connection blocks 38, which are serially connected by metal lines 40 and metal line 41. Throughout the description, metal lines 40 are equally referred to as inter-connection metal lines 40.

Figure 6A:
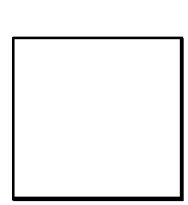
FIGS. 6A through 6E are exemplary top views of connection blocks.
Figure 6B:
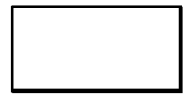
Figure 6C:
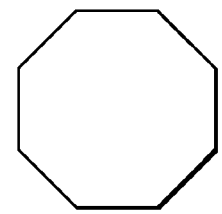
Figure 6D:
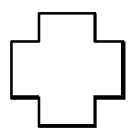
Figure 6E:
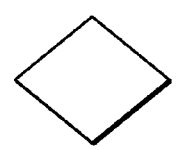

The top views of conductive pads 42 and metal pads 46 may have various shapes, such as a square as shown in FIG. 6A, a rectangular shape as shown in FIG. 6B, an octagon as shown in FIG. 6C, a cross as shown in FIG. 6D, or a diamond as shown in FIG. 6E.

Figure 7A:
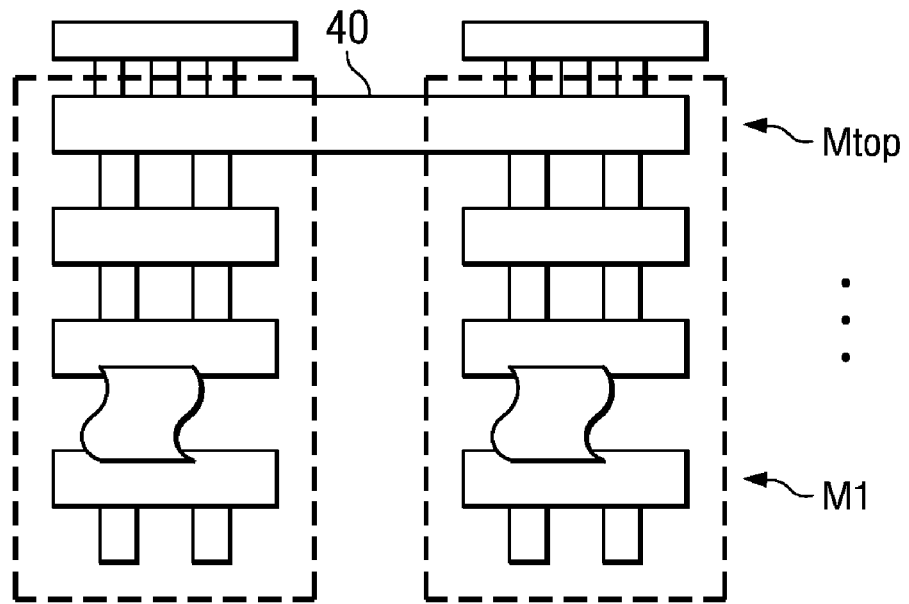
FIGS. 7A and 7B illustrate exemplary schemes for connecting the connection blocks in a same connection block cell.
Figure 7B:
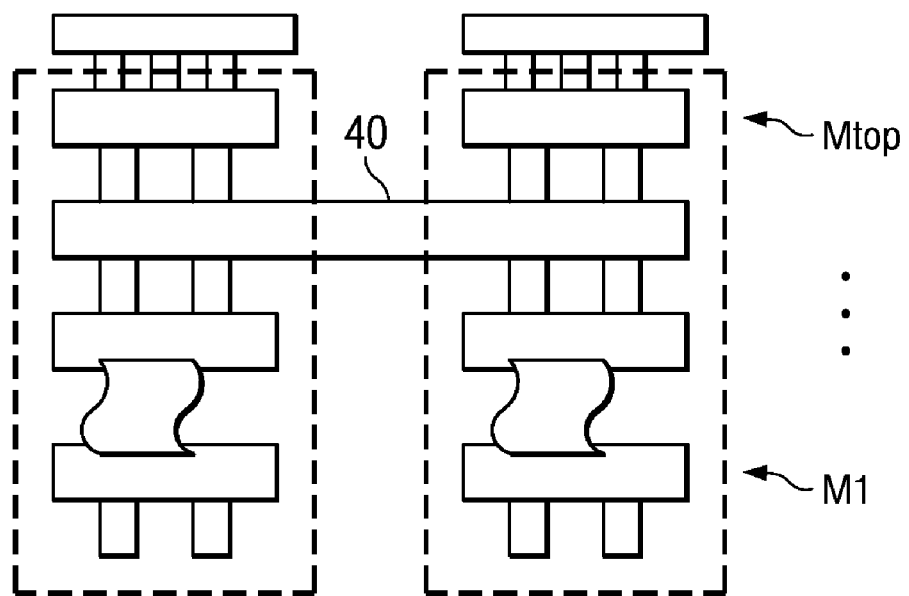

In FIG. 5A, the metal line 40 for connecting neighboring connection blocks 38 is formed in metallization layer M1. In alternative embodiments, as shown in FIG. 7A, metal line 40 is formed in top metallization layer Mtop. In yet other embodiments, metal line 40 is formed in an intermediate metallization layer between M1 and Mtop, as is shown in FIG. 7B. It is realized that if all metal lines 40 in all connection block cells 36 are formed in metallization layer Mtop, degradation that occurs in the bottom metallization layer, such as low-k delamination, may not be detected by the subsequently performed reliability test. Therefore, it is preferable that one test die 30 includes different types of connection block cells 36, and in each type of connection block cells 36, the corresponding metal lines 40 are formed in different metallization layers from other types. More preferably, the different types of connection block cells 36 are allocated in an alternative pattern.

Figure 8A:
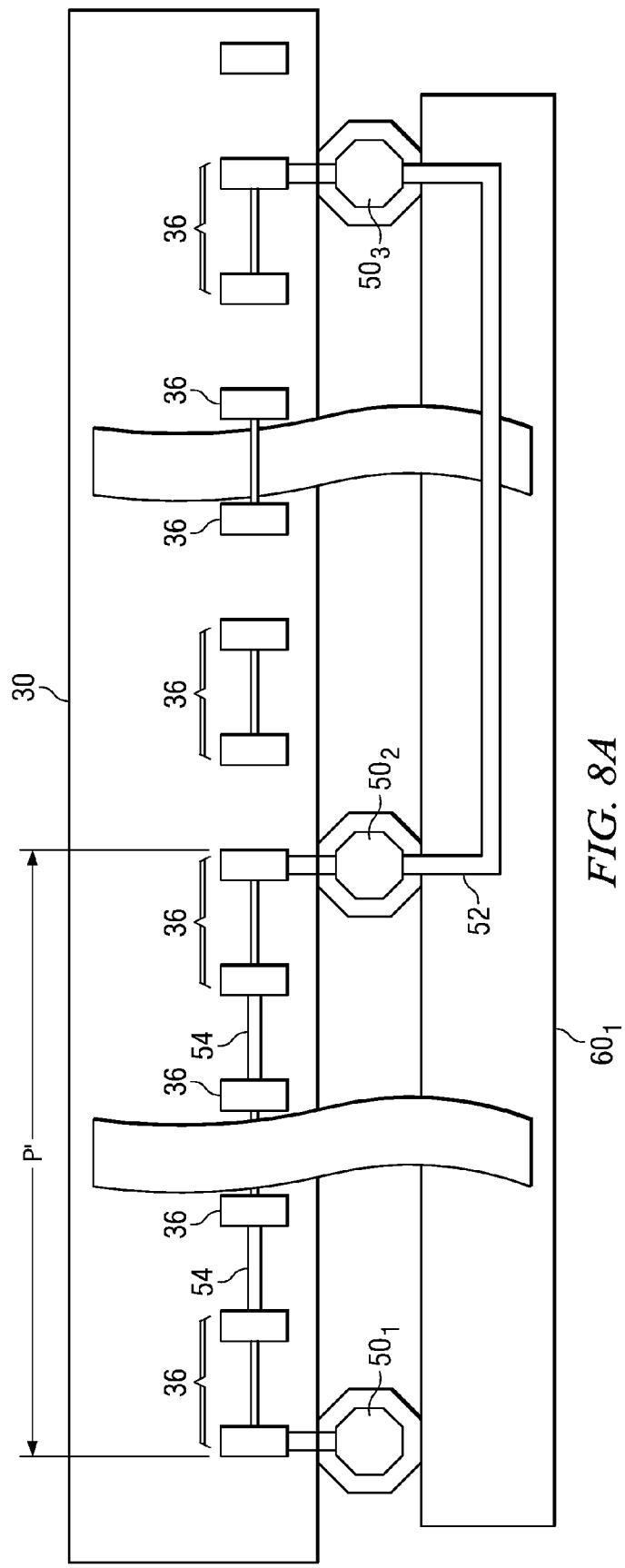
FIG. 8A schematically illustrates how a test die is bonded to a package substrate.

The design shown in FIG. 4 is alternatively referred to as breadboard design. Similar to the commonly known breadboards, the structure shown in FIG. 4 is flexible and can be easily connected into different circuits. FIG. 8A schematically illustrates a connecting scheme of the flexible breadboard structure, wherein test die 30 is bonded with (package) substrate 60₁. Neighboring connection block cells 36 are interconnected by cell connection lines 54. Preferably, cell connection lines 54 are formed in an upper layer of test die 30, preferably in the same layer as conductive pads 42 (refer to FIG. 5A), and hence cell connection lines 54 are also redistribution lines. Accordingly, a plurality of connection block cells 36 between solder bumps $50_1$ and $50_2$ is serially connected. Any current flowing between solder bumps $50_1$ and $50_2$ will thus flow through all of the serially connected connection block cells 36. On the other hand, the connection block cells 36 between solder bumps $50_2$ and $50_3$ are not interconnected, and are preferably floating. When substrate $60_1$ is bonded with test die 30, solder bumps $50_2$ and $50_3$ will be electrically connected through connection line 52 in substrate $60_1$. The connection scheme shown in FIG. 8A may be repeated throughout the package structure to form one or more daisy chains. Therefore, test die 30 can be used to test both the reliability of the interconnect structures in test die 30 and substrate $60_1$, and the interconnection therebetween.

Figure 8B:
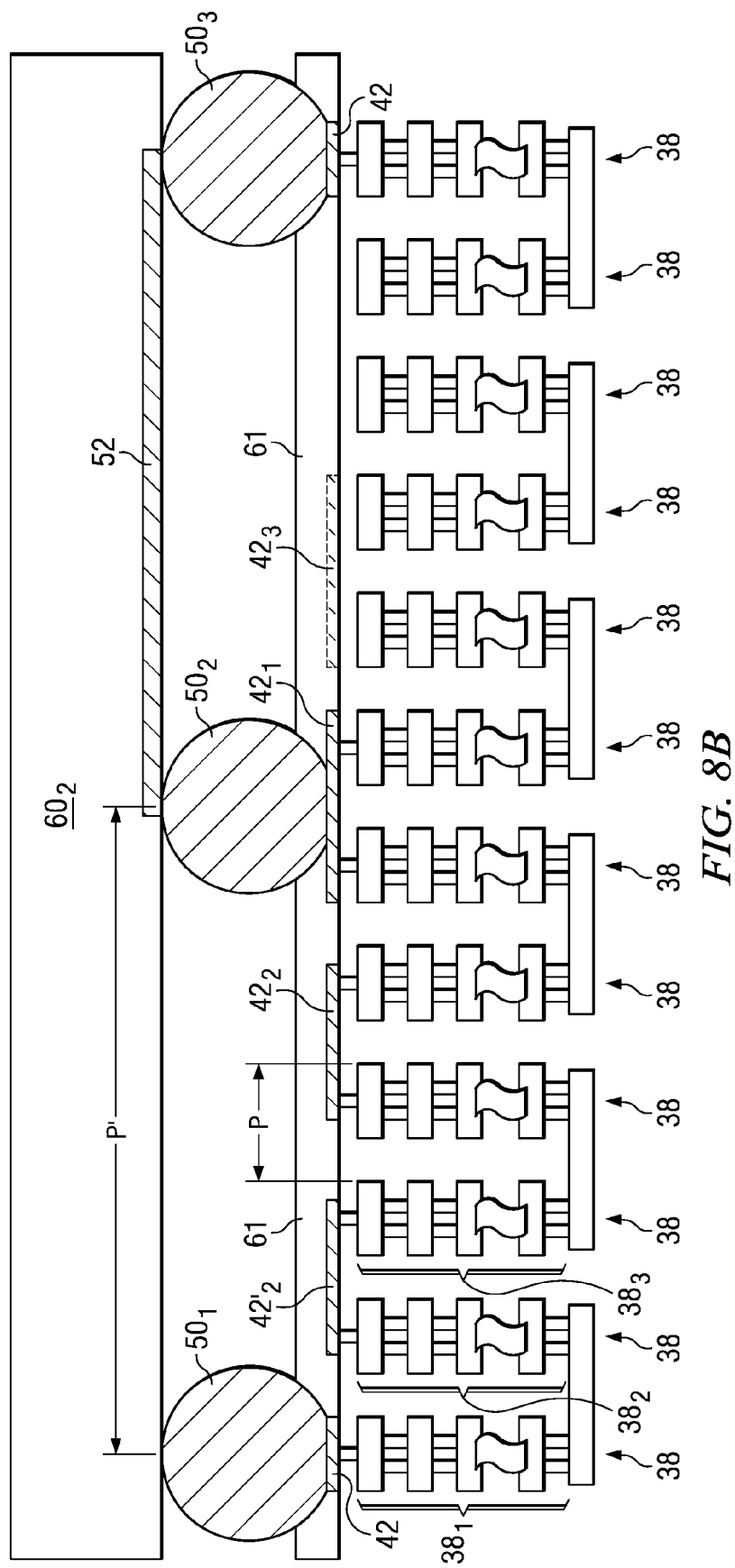
FIG. 8B illustrates a cross-sectional view of the structure shown in FIG. 8A.

FIG. 8B illustrates a cross-sectional view of a structure implementing the scheme shown in FIG. 8A. It is noted that solder bumps $50_1$, $50_2$, and $50_3$ are connected to the conductive pads 42. Throughout the description, conductive pads 42 may be referred to with subscriptions. Conductive pads 42 are exposed through openings in passivation layer 61, and hence are also referred to as bond pads 42. An advantageous feature of the present invention is that the pitch P of connection blocks 38 may be designed smaller than the minimum pitch of solder bumps for existing technology. In an exemplary embodiment, the minimum pitch is about 50 μm. Apparently, pitch P is also smaller than pitch P' of solder bumps 50 (including solder bumps $50_1$, $50_2$, and $50_3$). Therefore, if test die 30 is to be used for testing another product, whose package substrate has a different pitch than the pitch P' of solder bumps 50, solder bumps may be landed on different conductive pads 42. For example, if another product requires a substrate $60_2$ to have a pitch less than pitch P', solder bump $50_2$ may land on conductive pad $42_2$, which is now exposed to act as a bond pad, instead of conductive pad $42_1$. Accordingly, conductive pad $42_1$ may or may not be exposed. Conversely, if another product requires substrate $60_2$ to have a pitch greater than pitch P', conductive pad $42_3$ may be exposed to act as a bond pad, and solder bump $50_2$ may land on bond pad $42_3$ instead of conductive pad $42_1$. Please note that the minimum pitch P' is equal to twice pitch P. In this case, solder bump 502 lands on bond pad $42_2'$. In this case, within a bump pitch P', there are three connection blocks $38_1$, $38_2$, and $38_3$. If the pitch P becomes smaller with relative to bump pitch P', the number of connection blocks within bump pitches increases. Accordingly, in the preferred embodiment, pitch P' of solder bumps 50 is preferably equal to, or greater than twice the pitch P of connection blocks 38. Pitch P' may be expressed as P'=NP, wherein N is an integer equal to, or greater than, 2. In an exemplary embodiment, pitch P' is greater than about 50 μm.

In the above discussed embodiments, the layer having conductive pads 42 (or redistribution lines) may be modified to provide different test die designs, while the design of connection block cells 36 does not need to be changed. However, other top conductive layers, such as copper redistributions lines, top metallization layer, and even some metallization layers underlying the top metallization layer, may also be modified to provide different test die designs. However, as will be discussed in subsequent paragraphs, cost increases when lower layers need to be changed.

Figure 9A:
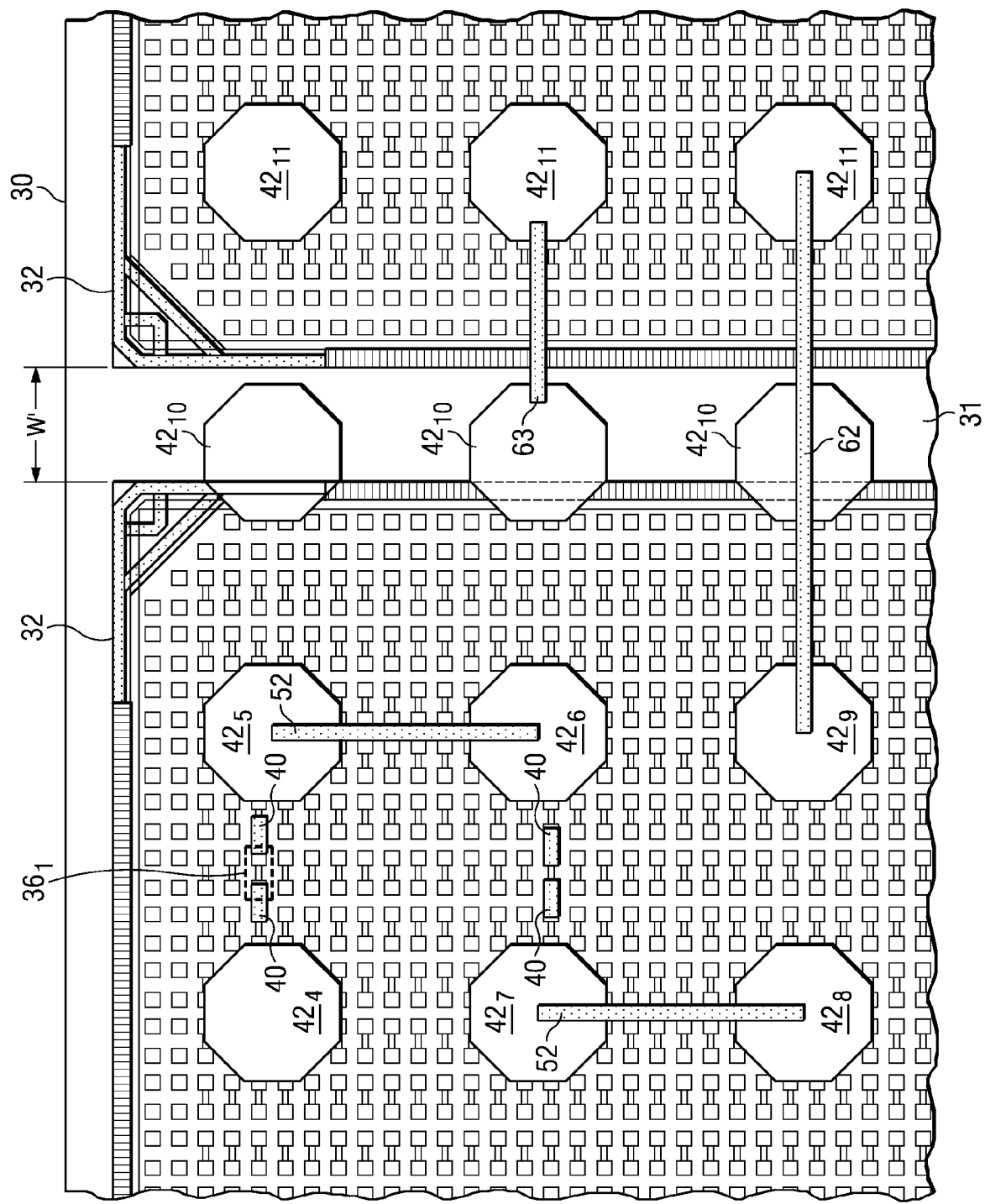
FIG. 9A illustrates aluminum pads formed in a unit block and in a unit block boundary line.
Figure 9B:
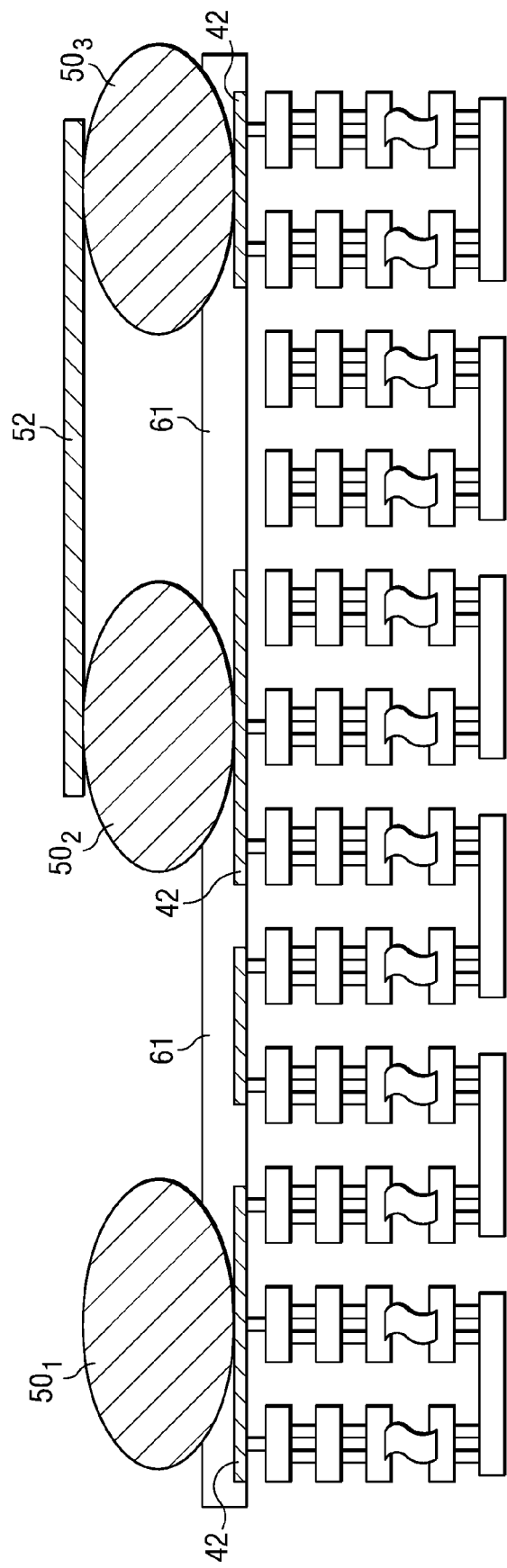
FIG. 9B illustrates a cross-sectional view of a portion of a structure shown in FIG. 9A.

Referring to FIG. 9A, which is a top view of a portion of test die 30, conductive pads 42 (or other bonding pads) may be greater than the sizes of the metal pads 46 and vias 44 (refer to FIG. 5). Accordingly, conductive pads 42 each may cover, and electrically connect to, a plurality of underlying connection block cells 36. For example, conductive pads $42_4$ through $42_9$, each covers and interconnects to about 16 connection block cells 36. However, between two neighboring bond pads, such as bond pads $42_4$ and $42_5$, only one electrical path exists, which includes connection block cell $36_1$ and connecting metal lines 40, although more connection block cells may be serially connected with connection block cell $36_1$. Conductive pads $42_5$ and $42_6$ are connected through connection line 52, which is in substrate $60_2$ (refer to FIG. 8B). By repeating the connecting scheme similar to that of bond pads $42_4$, $42_5$, and $42_6$, a daisy chain may be formed.

FIG. 9A also illustrates dummy conductive pads $42_{10}$, each having at least a part in unit block boundary line 31. Dummy conductive pads $42_{10}$ may or may not be electrically connected to the daisy chain. However, dummy solder bumps (similar to solder bumps 42 in FIG. 8B, not shown in FIG. 9A) are preferably mounted on dummy conductive pads $42_{10}$ and between test die 30 and the respective substrate (for example, substrate $60_1$ or $60_2$ as shown in FIGS. 8A and 8B), so that the conductive pads and solder bumps can be distributed more uniformly throughout the test die. In an embodiment, dummy conductive pads $42_{10}$ have a width greater than the width W' of unit block boundary lines 31. In alternative embodiments, dummy conductive pads $42_{10}$ have a width smaller than the width W' of unit block boundary lines 31, and hence can be fit fully into unit block boundary lines 31. If unit block boundary line 31 is inside a test die, conductive pads $42_{10}$ may actually be used for forming daisy chains. In this case, conductive pads $42_{10}$ may be connected to a connection conductive pad inside a unit block 32, such as conductive pad $42_{11}$, through connection line 63 in the respective package substrate. Alternatively, two conductive pads 42 in different unit blocks 32 may be directly connected through connection line 62, which is also in the package substrate.

From the discussions of FIGS. 8A though 9B, it may be found that regardless of the bump pitches of substrates 60 (for example, substrates $60_1$, $60_2$, or $60_3$), the positions and sizes of connection block cells 36 are fixed. Assuming for a first set of package substrates having first bump pitches, a first test wafer has been designed to match the first bump pitches. Due to the use of different products or different designs, a second test wafer needs to be designed to suit second bump pitches of a second set of package substrates, which are different from the first bump pitches. Since the second test wafer may reuse the design of connection block cells 36 on the first test wafer, only the designs of metal lines/conductive pads 42 and the overlying passivation layer(s) 61 (refer to FIG. 8B) needs to be changed. Accordingly, all the masks for connection block cells 36 may be reused, and only the masks for metal lines/conductive pads 42 and the overlying passivation layer(s) 61 need to be redesigned during the re-tape out.

By using the embodiments of the present invention, the cost and the cycle time for taping out test wafers (dies) may be significantly reduced. Without the need to redesign the metallization layers including bottom metallization layer M1 through top metallization layer Mtop, the cycle time may be reduced, for example, from about one and half months to about one to two weeks. The cost related to the redesign and the masks of these layers are eliminated. In addition, since test wafers include unit blocks having repeated patterns, the sizes of the test dies are no longer limited by the size of masks, for example, 26 mm by 32 mm. The sizes of test dies may simply expanded by including more rows and columns of unit blocks 32 (refer to FIGS. 3A through 3D).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:
    forming a first test wafer comprising:
        providing a first semiconductor substrate;
        forming a plurality of connection blocks, with at least one of the plurality of connection blocks comprising a plurality of metal pads in a plurality of metallization layers of the first test wafer, wherein the plurality of metal pads is vertically overlapped, and is interconnected through vias;
        forming a first plurality of unit blocks over the first semiconductor substrate, wherein at least one of the first plurality of unit blocks comprises a plurality of connection block cells arranged as an array, and wherein at least one of the connection block cells comprises two of the plurality of connection blocks, and a metal line connecting the two of the plurality of connection blocks;
        forming a plurality of unit block boundary lines separating the first plurality of unit blocks from each other; and
        forming a first plurality of metal lines connecting a portion of the first plurality of unit blocks.

2. The method of claim 1 further comprising sawing a first test die from the first test wafer along a portion of the plurality of unit block boundary lines.

3. The method of claim 2, wherein the first test die comprises at least one of the unit block boundary lines, and wherein at least one of the at least one of the unit block boundary lines separates unit blocks in the first test die into two portions.

4. The method of claim 1 further comprising:
    forming a second test wafer comprising:
        providing a second semiconductor substrate;
        forming a second plurality of unit blocks over the second semiconductor substrate using a same set of masks as for forming the first plurality of unit blocks; and
        forming a second plurality of metal lines connecting a portion of the second plurality of unit blocks, wherein the second plurality of metal lines has a different pattern than the first plurality of metal lines, and wherein the first and the second plurality of metal lines are redistribution lines over a top metallization layer and have different pitches.

5. A method for verifying an integrated circuit (IC) design, the method comprising:
    receiving a chip design; and
    verifying the chip design comprising:
        forming a test structure comprising a plurality of unit blocks having a tile-like pattern, with the plurality of unit blocks arranged by rows and columns, wherein each of the plurality of unit blocks comprises a plurality of connection blocks having a breadboard pattern, and wherein the test structure comprises at least two bump pads with a bump pitch, and wherein at least three of the plurality of connection blocks are located within the bump pitch.

6. The method of claim 5, wherein at least one of the plurality of unit blocks has a first dimension in a first direction and a second dimension in a second direction perpendicular to the first direction, wherein the first dimension equals the second dimension.

7. The method of claim 5, wherein at least one of the plurality of unit blocks has a first dimension in a first direction and a second dimension in a second direction perpendicular to the first direction, wherein the first dimension is different from the second dimension.

8. The method of claim 7, wherein the first dimension is greater than 5.2 mm, and the second dimension is less than about 5.2 mm.

9. The method of claim 5 further comprising taping-out a first mask for a layer comprising first conductive features for interconnecting the plurality of connection blocks.

10. The method of claim 9 further comprising taping-out a second mask for a layer comprising second conductive features for interconnecting the plurality of connection blocks, wherein the second mask has a different pattern than the first mask.

11. The method of claim 9, wherein the layer of the first mask is selected from the group consisting essentially of an aluminum layer, a top metallization layer, and a redistribution layer.

12. The method of claim 5, wherein the test structure comprises a daisy chain comprising at least a portion of the plurality of connection blocks.

13. A method for verifying an integrated circuit (IC) design, the method comprising:
    receiving a chip design; and
    verifying the chip design comprising:
        forming a test structure comprising a test wafer comprising a plurality of connection blocks arranged as a breadboard pattern, with at least one of the plurality of connection blocks comprising a plurality of metal pads in a plurality of metallization layers of the test wafer, wherein the plurality of metal pads is vertically overlapped, and is interconnected through vias.

14. The method of claim 13, wherein the plurality of connection blocks is grouped as a plurality of unit blocks, and wherein the test structure further comprises a plurality of unit block boundary lines separating the plurality of unit blocks.

15. The method of claim 14, wherein at least one of the plurality of unit blocks has a first dimension in a first direction and a second dimension in a second direction perpendicular to the first direction, wherein the first dimension equals the second dimension.

16. The method of claim 14, wherein at least one of the plurality of unit blocks has a first dimension in a first direction and a second dimension in a second direction perpendicular to the first direction, wherein the first dimension is different from the second dimension.

17. The method of claim 13, wherein the test structure comprises at least two bump pads with a bump pitch, and wherein at least three of the plurality of connection blocks are located within the bump pitch.

18. The method of claim 13, wherein the test structure further comprises a layer comprising first conductive features interconnecting the plurality of connection blocks, and wherein the method further comprises taping-out a first mask for the layer, and taping-out a second mask for an additional layer comprising second conductive features for interconnecting the plurality of connection blocks, wherein the second mask has a different pattern than the first mask.

19. The method of claim 18, wherein the layer of the first mask is selected from the group consisting essentially of an aluminum layer, a top metallization layer, and a redistribution layer.

20. The method of claim 1, wherein the plurality of metallization layers comprises all metallization layers in the test wafer, and wherein the plurality of metal pads comprises one metal pad in each of the plurality of metallization layers.

21. The method of claim 13, wherein the plurality of metallization layers comprises all metallization layers in the test wafer, and wherein the plurality of metal pads comprises one metal pad in each of the plurality of metallization layers.

* * * * *